United States Patent
Basak et al.

(10) Patent No.: US 12,520,458 B2
(45) Date of Patent: Jan. 6, 2026

(54) VAPOR COMPRESSION ASSISTED LIQUID COOLING SYSTEM FOR ELECTRONIC COMPONENTS

(71) Applicant: Intel Corporation, Santa Clara, CA (US)

(72) Inventors: Sankarananda Basak, Campbell, CA (US); Akhilesh Rallabandi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 201 days.

(21) Appl. No.: 18/398,228

(22) Filed: Dec. 28, 2023

(65) Prior Publication Data

US 2025/0220857 A1    Jul. 3, 2025

(51) Int. Cl.
H05K 7/20    (2006.01)

(52) U.S. Cl.
CPC ..... *H05K 7/20354* (2013.01); *H05K 7/20318* (2013.01); *H05K 7/20327* (2013.01); *H05K 7/2039* (2013.01)

(58) Field of Classification Search
CPC .................... H05K 7/20354; H05K 7/2039
See application file for complete search history.

(56) References Cited

U.S. PATENT DOCUMENTS

| | | | | |
|---|---|---|---|---|
| 6,537,019 | B1 * | 3/2003 | Dent | F04D 25/166 |
| | | | | 361/679.48 |
| 11,448,441 | B2 * | 9/2022 | Zeigler | F25B 49/02 |
| 2004/0139756 | A1 * | 7/2004 | Wall | G01R 31/2874 |
| | | | | 62/223 |
| 2007/0095087 | A1 * | 5/2007 | Wilson | G06F 1/20 |
| | | | | 361/702 |

OTHER PUBLICATIONS

Burnett, J., "Advaces in Vapor Compression Electronics Cooling", Electronics Cooling, 2008, 12 pages, retrieved from https://www.electronics-cooling.com/2014/05/advances-vapor-compression-electronics-cooling/.
"EK-QuantumX Delta TEC—Copper + Nikkel", ekwb.com, 2023, 5 pages, available at https://www.ekwb.com/shop/ek-quantumx-delta-tec.

(Continued)

*Primary Examiner* — Lionel Nouketcha
(74) *Attorney, Agent, or Firm* — Virering, Jentschura & Partner mbB (57) ABSTRACT

Disclosed herein are devices, methods, and systems for cooling an electronic component. The cooling device includes a liquid cooling loop with a heat exchanger, wherein the liquid cooling loop thermally conductively connects to the electronic component. The cooling device also includes a vapor compression cooling loop with a compressor and an expansion nozzle. The cooling device also includes an intermediate heat exchanger between the liquid cooling loop and the vapor compression cooling loop for exchanging heat between the liquid cooling loop and the vapor compression cooling loop. The cooling device also includes a controller configured to selectively activate the vapor compression cooling loop based on a power consumption of the electronic component.

20 Claims, 5 Drawing Sheets

(56) References Cited

OTHER PUBLICATIONS

Slagle, R., "How Vapor-Compression Cooling Works", Electronics Cooling, 2017, 9 pages, available at https://www.electronics-cooling.com/2017/07/vapor-compression-cooling-works/.

Poachaiyapoom, A., et al., "Miniature vapor compression refrigeration system for electronics cooling", Case Studies in Thermal Engineering, Elsevier, 2019, 7 pages.

Peeples, J. W., "Vaport Compression Cooling for High Performance Applications", Electronics Cooling, 2001, 13 pages, available at https://www.electronics-cooling.com/2001/08/vapor-compression-cooling-for-high-performance-applications/.

* cited by examiner

VAPOR COMPRESSION ASSISTED LIQUID COOLING SYSTEM FOR ELECTRONIC COMPONENTS

TECHNICAL FIELD

The disclosure relates generally to cooling systems for electronic components, such as processors, that may need to be actively cooled, and in particular, to a vapor compression assisted liquid cooling system.

BACKGROUND

Many electronic components, such as processors, may benefit from active cooling. If an active cooling system, such as fans, heatsinks, or vapor compression cooling is used, the improved thermal dissipation may allow the processor to operate at higher power levels, providing additional performance headroom. This additional performance headroom is particularly sought-after in the high-end computer gaming and enthusiast segments, where graphics processing and application processing are often pushed to their highest operating limits, often through the use of increased frequency through mechanisms like Thermal Velocity Boost (TVB) or through overclocking. In conventional computing systems, ambient cooling systems are often utilized (e.g., through liquid cooling and air cooling) to provide thermal dissipation. Sub-ambient cooling solutions such as vapor compression and solid-state refrigeration have also been used for cooling electronic components in computing systems, but the existing solutions tend to be exotic and costly in terms of power consumed for delivering the thermal dissipation.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which.

DESCRIPTION

The following detailed description refers to the accompanying drawings that show, by way of illustration, exemplary details and features.

The word "exemplary" is used herein to mean "serving as an example, instance, or illustration." Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in the form of a pointer. The term "data", however, is not limited to the aforementioned examples and may take various forms and represent any information as understood in the art.

The terms "processor" or "controller" as, for example, used herein may be understood as any kind of technological entity (e.g., hardware, software, and/or a combination of both) that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, software, firmware, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

As noted above, computing systems conventionally use ambient cooling systems that use liquid cooling (e.g., an all-in-one (AIO) liquid cooler connected to the component) and/or air cooling (e.g., fans directed toward the component or heatsink of the component) to provide thermal dissipation. While AIO liquid cooling may provide reasonable performance, it does not provide low enough temperatures (e.g., sub-ambient) that may be need to for the to-be-cooled component to operate at higher processing powers to provide performance headroom. While sub-ambient cooling solutions such as vapor compression and solid-state refrigeration have also been used in computing systems to cool electronic components, the existing solutions tend to be exotic and costly in terms of power consumed for delivering the thermal dissipation. Applying a vapor compression refrigerant directly to the cooling head of the component-to-be-cooled, for example, may be costly in terms of power consumption, especially when the component is in a low/normal power mode that does not require such aggressive thermal dissipation at all times. In addition, a thermoelectric cooler (TEC) may be used, but connecting a solid state TEC cooler directly on top of the processor may be less efficient than vapor compression refrigeration-based cooling due to the high energy required by the TEC cooler. TEC coolers may not be able to handle high power, as there may be a performance inversion at very high powers as compared to liquid coolers. In addition, switching off a TEC cool may result in much poorer performance than a standard liquid cooler.

Figure 1:
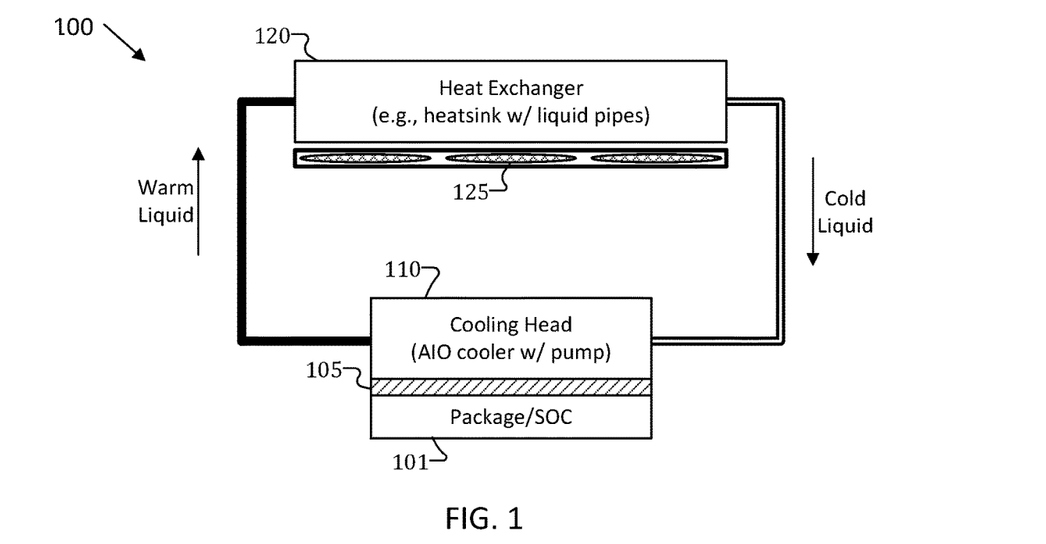
FIG. 1 shows an example of a typical ambient cooling system for cooling an electronic component at ambient temperature.

FIG. 1 depicts an example of a simple liquid cooling loop 100 that may be used to cool an electronic component such as a package or system-on-chip (SOC) (e.g., package/SOC 101). A cooling head 110 of an all-in-one (AIO) cooler (e.g., along with an embedded pump to circulate the cooling liquid) may connect to the package/SOC 101, for example through a thermal interface material (TIM) 105 that provides thermal conduction between the package/SOC 101 and the liquid circulating into and out of the cooling head 110. Heat from the package/SOC 101 is transferred to the cooling liquid (which is thereby warmed) and the warmed cooling liquid circulates from the cooling head 110 towards a heat exchanger 120 (e.g., a heat sink with liquid pipes). The warm liquid is cooled at the heatsink (e.g., via fans 125 that blow across liquid pipes) and circulates the liquid back toward the package/SOC 101 as a cold liquid that feeds into the cooling head 110. The process continues in a loop to provide continuous cooling of the package/SOC 101 at cooling head 110. As should be understood, the heat exchanger 120 operates at ambient temperature, which means that thermal dissipation may depend on the temperature difference between the liquid coolant and the ambient temperature, which may limit the ability of the liquid cooling loop 100 to provide high levels of cooling, especially at warm ambient temperatures.

Figure 2:
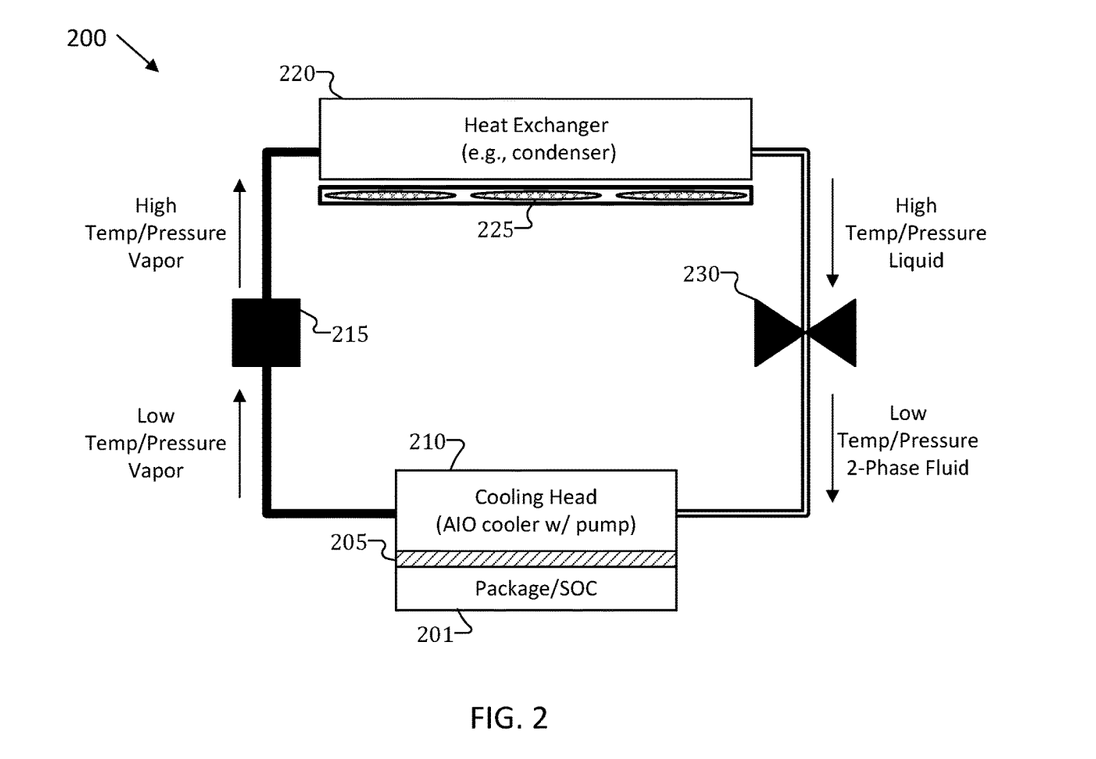
FIG. 2 shows an example of a typical sub-ambient cooling system for cooling an electronic component at temperatures below ambient.

FIG. 2 illustrates an example of a vapor compression cooling loop 200 that uses compression and expansion to achieve sub-ambient cooling. Like the liquid cooling loop 100 of FIG. 1, a cooling head 210 of an AIO cooler may connect to the package/SOC 201 through TIM 205. Heat from the package/SOC 201 is transferred to the cooling refrigerant (which may start as a 2-phase fluid, for example, and is thereby warmed to a gas/vapor) and the warmed vapor then circulates from the cooling head 210 towards a compressor 215 that compresses the vapor into a high pressure vapor, which is then circulated to the heat exchanger 220 (e.g., a condenser with fans 225). In vapor compression cooling loop 200, the heat exchanger 220 may be a condenser that dissipates heat by condensing the high temperature vapor into a high temperature liquid. This high temperature liquid is then circulated to an expansion nozzle 230 where the liquid expands into a lower pressure 2-phase fluid that feeds back to the cooling head 210 for absorbing heat from the package/SOC 201, where the cycle continues. Due to the compression/expansion, vapor compression cooling loop 200 may be able to provide higher levels of cooling than the liquid cooling loop 100 of FIG. 1, especially at warm ambient temperatures. The tradeoff however is efficiency in that there is a higher energy cost associated with operating the vapor compression cooling loop 200 as compared to the liquid cooling loop of FIG. 1.

In contrast to a purely liquid cooling loop (e.g., of FIG. 1) or a purely vapor compression cooling loop (e.g., of FIG. 2), the vapor compression assisted liquid cooling (VCLC) systems disclosed in more detail below are hybrid approaches (e.g., a hybrid cooling configuration) that may provide a way of energy-efficiently cooling an electronic component at and below ambient temperatures. The VCLC systems disclosed below may provide (1) high energy-efficient cooling similar to those of conventional all-in-one (AIO) liquid coolers as well as (2) a switchable high thermal-performance sub-ambient cooling that leverages a vapor compression loop when higher thermal dissipation is needed or desired. In particular, VCLC systems may use a hybrid combination of a water-cooling loop connected to a heat exchanger (e.g., a combination heat exchanger/fan unit) along with a supplementary vapor compression cooling loop in a hybrid cooling configuration. The water-cooling loop may then be used when the component is operating at normal/low power, such that ambient cooling may provide for sufficient thermal dissipation. When increased thermal dissipation is desired (e.g., when the component is operating a higher power or operated with overclocking), a controller may enable the supplementary vapor compression cooling loop to provide sub-ambient cooling that may provide a higher level of thermal dissipation.

This hybrid, two-loop cooling system (simply referred to as a "VCLC" herein or a hybrid cooling configuration) may allow for (1) energy-efficient cooling of the to-be-cooled component when extensive thermal dissipation is not needed (e.g., when overclocking headroom is not needed) and (2) high performance heat dissipation of the to-be-cooled component when the component is operating at higher powers and/or when overlocking headroom may be desired (e.g., when more extensive thermal dissipation may be needed). The controller may configure the two loops such that the two loops complement each other and are enabled according to the thermal dissipation targets for the to-be-cooled component. As noted above, this may be particularly applicable for high-end gaming systems or enthusiasts, who may wish to variably operate their computing components (e.g., processors) at high power and/or with overclocking, where energy efficient and extensive thermal dissipation may be necessary to achieve the desired performance.

Figure 3:
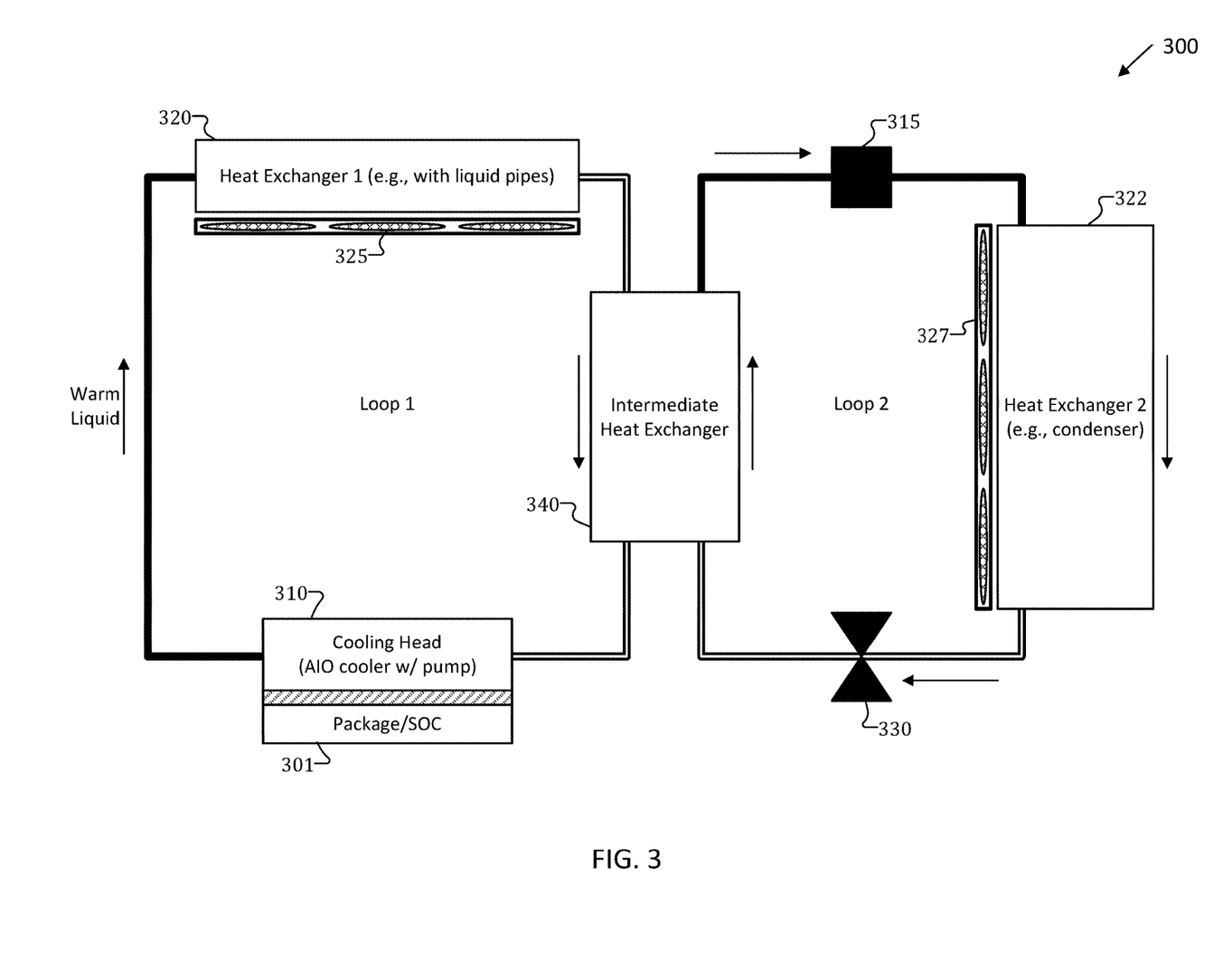
FIG. 3 illustrates an exemplary vapor compression assisted liquid cooling (VCLC) system for efficiently cooling an electronic component at ambient and below ambient temperatures.

FIG. 3 shows an example of a VCLC system 300 that may be used for cooling electronic components (e.g., package/SOC 301) with different levels of thermal dissipation, depending on the activation of a vapor compression cooling loop (Loop 2). A liquid cooling loop (e.g., "Loop 1") may be used when low or normal heat dissipation is needed (e.g., during times when the to-be-cooled component (e.g., package/SOC 301) is operating at lower power, normal clocking speeds, and/or the difference to the ambient temperature is sufficient to provide the required thermal dissipation via the liquid cooling loop. To provide additional thermal dissipation, a vapor compression loop (e.g., "Loop 2") may be thermally connected to the liquid cooling loop (e.g., via an intermediate heat exchanger 340 that provides a thermal interface between Loop 1 and Loop 2).

A controller (not shown) may enable and disable Loop 2 (the vapor compression loop) based on whether additional thermal dissipation is desired or needed (e.g., because the user is operating the package/SOC 301 at a high power; the ambient temperature is too high, such that the liquid cooling loop is insufficient; the package/SOC 301 is being overclocked, etc.). When Loop 2 is enabled, the vapor compression loop may provide sub-ambient cooling to an intermediate heat exchanger 340, which further cools the liquid that is circulating from heat exchanger 320 to cooling head 310 (e.g., pre-cooling the liquid before it enters cooling head 310). Heat from the liquid that leaves heat exchanger 320 is transferred via the intermediate heat exchanger 340 to the cooling refrigerant in Loop 2, which warms the cooling refrigerant to a warmed vapor that circulates to compressor 315. Compressor 315 compresses the vapor into a high pressure vapor, which is then circulated through heat exchanger 322 (e.g., a condenser) to an expansion nozzle 330, where the liquid expands into a lower pressure 2-phase fluid that feeds back to the intermediate heat exchanger 340 for absorbing heat from the liquid in Loop 1. The cycle may continue until the controller disables Loop 2 (e.g., when additional thermal dissipation from the vapor compression loop is no longer desired or needed).

The controller may vary the mode of operation (e.g., between liquid cooling by only Loop 1 and vapor compression-assisted cooling by activating Loop 2) based on a number of different factors. The control system may independently control Loop 1 and Loop 2, and more particularly, the fan elements (e.g., 325 327) of each loop's heat exchanger (e.g., 320, 322), depending on the desired cooling in each loop. In a standard liquid cooling mode, for example, only the liquid cooling loop (Loop 1) may be enabled while the vapor compression loop (Loop 2) is disabled (e.g., the compressor, fans, circulation pump, etc. are switched off).

In a dew-point aware, sub-ambient cooling mode, the liquid cooling loop (Loop 1) may be enabled and the vapor compression loop (Loop 2) may be enabled based on whether a temperature of the liquid input to the cooling head (e.g., cooling head 310) is at or slightly higher than the dew point (e.g., where the goal is to maintain temperature of the liquid input to the cooling head 310 to be at or slightly higher than the dew point). In this mode, the controller may switch off fans 325 at the heat exchanger 320 of Loop 1 if the ambient temperature is greater than the temperature of the fluid entering the heat exchanger 320. This may prevent the ambient air from heating up the fluid that is passing through the heat exchanger 320.

In a maximum performance, sub-ambient cooling mode, both the liquid cooling loop (Loop 1) and the vapor compression loop (Loop 2) may be enabled, irrespective of the dew point. In this mode, the controller may also switch off fans 325 at the heat exchanger 320 of Loop 1 if the ambient temperature is greater than the temperature of the fluid entering the heat exchanger 320. As should be understood, these operation modes are merely exemplary, and any number of factors may be used to determine whether and when to enable Loop 2 and/or whether and when to enable fans 325 and/or fans 327.

Figure 4:
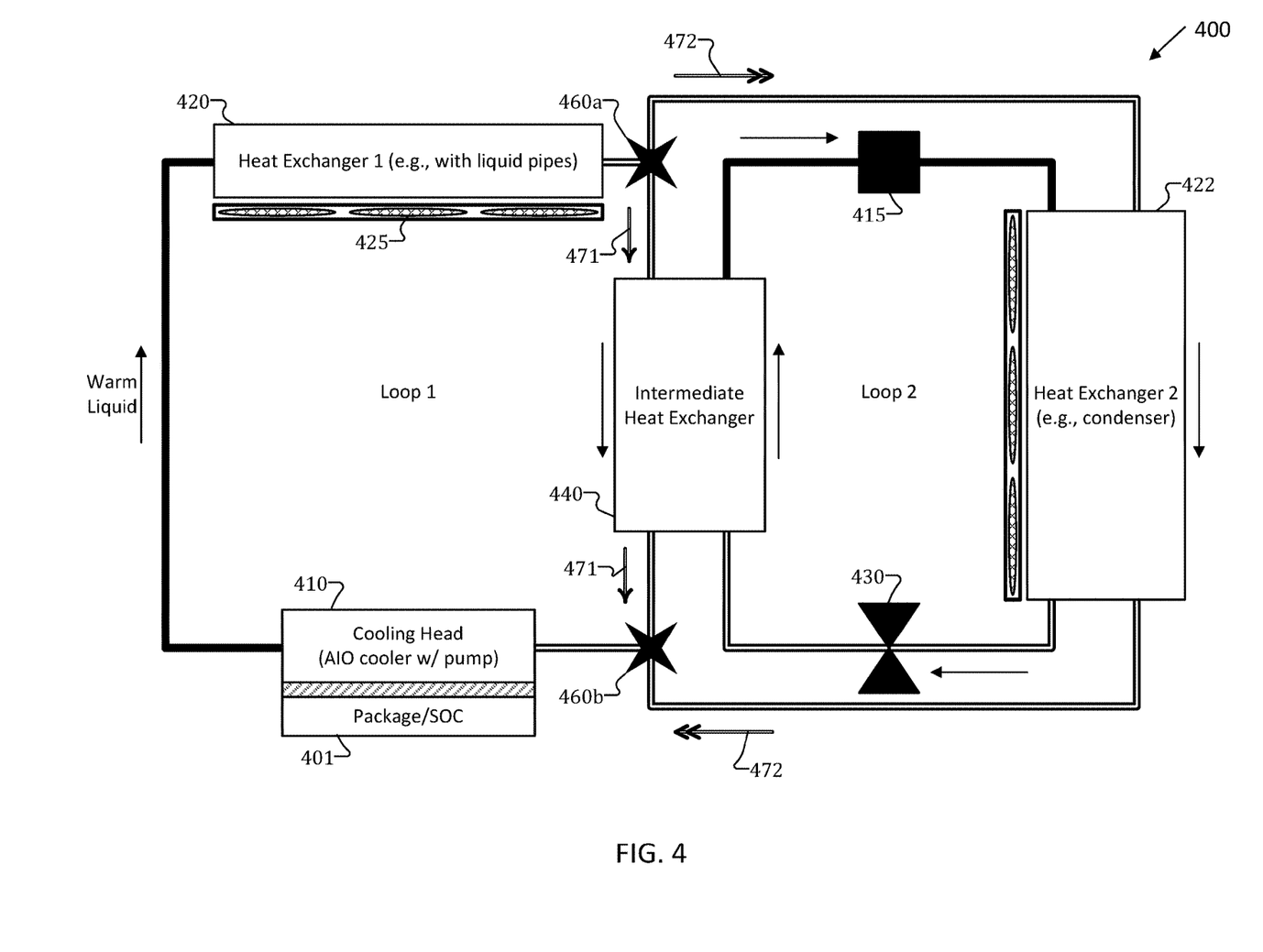
FIG. 4 depicts an exemplary VCLC system with optional bypassing.

FIG. 4 shows an example of a VCLC system 400 that may be used for cooling electronic components (e.g., package/SOC 401) with different levels of thermal dissipation based on the activation of a vapor compression cooling loop (Loop 2) and/or the activation of a bypass to a secondary heat exchanger (e.g., heat exchanger 422). The VCLC system 400 is similar to VCLC system 300 of FIG. 3 in that VCLC system 400 includes a liquid cooling loop (Loop 1, including cooling head 410, and heat exchanger 420) and a vapor compression loop (Loop 2, including compressor 415, heat exchanger 422 (e.g., a condenser), and expansion nozzle 430) that may be separately enabled/disabled are connected to one another via an intermediate heat exchanger 440. In addition, VCLC system 400 also includes a bypass valve (e.g., 460a, 460b) that, if enabled, provides a bypass for liquid leaving the heat exchanger 420 to flow into heat exchanger 422 and back to cooling head 410 (as shown by double-headed arrows 472), rather than passing through the intermediate heat exchanger 440 (as shown by single-headed arrows 471). This allows for an additional cooling mode in which the circulation through Loop 2 (and its corresponding compressor 415 and expansion nozzle 430) are switched off, but where the fluid from Loop 1's heat exchanger 420 bypasses the intermediate heat exchanger 440 in order to pass through heat exchanger 422 before returning to the cooling head 410. As should be understood, one or more of the bypass valve(s) (e.g., 460a, 460b) may be controlled by the controller in order to configure VCLC system 400 to provide this additional cooling mode.

Figure 5:
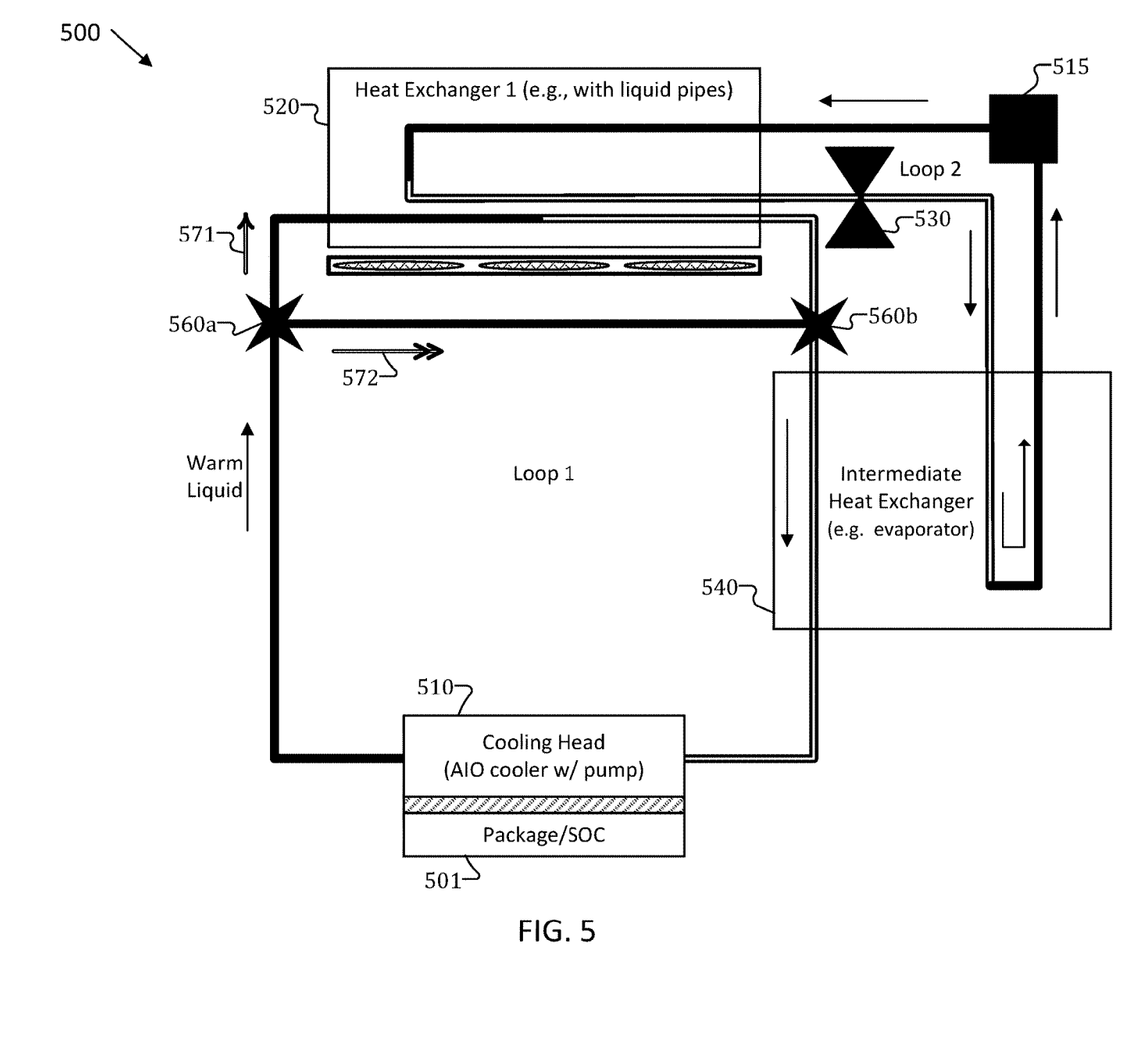
FIG. 5 shows an exemplary an exemplary VCLC system where the liquid cooling may share a heat exchanger with the vaper compression cooling.

FIG. 5 shows an example of a VCLC system 500 that may be used for cooling electronic components (e.g., package/SOC 501) with different levels of thermal dissipation based on the activation of a vapor compression cooling loop (Loop 2), where the vapor compression cooling loop (Loop 2) shares a heat exchanger with the liquid cooling loop (Loop 1). The VCLC system 500 is similar to VCLC system 300 of FIG. 3 and VCLC system 400 of FIG. 4 in that VCLC system 500 includes a liquid cooling loop (Loop 1, including cooling head 510, and heat exchanger 520) and a vapor compression loop (Loop 2) that includes compressor 515 and expansion nozzle 530) that may be separately enabled/disabled are connected to one another via an intermediate heat exchanger 540. However, in VCLC system 500, Loop 2 does not have its own heat exchanger and instead may utilize the heat exchanger 520 of Loop 1. Thus, when Loop 2 is active, Loop 1 may be effectively disabled by bypassing the heat exchanger 520 in Loop 1 so that Loop 2 may utilize heat exchanger 520. When Loop 2 is not active, Loop 1 may utilize heat exchanger 520 as normal. For bypassing, a controller may control bypass valve(s) (e.g., valves 560a, 560b) to control whether the liquid in the liquid cooling loop (Loop 1) bypasses heat exchanger 520 (see double-headed arrow 572) or whether it flows directly to the intermediate heat exchanger 540 (see single-headed arrow 571) to take advantage of the vapor compression cooling loop (Loop 2).

The VCLC system 500 may vary the mode of operation, similar to VCLC system 300 described above (e.g., via a controller). In a standard liquid cooling mode, for example, only the liquid cooling loop (Loop 1) may be enabled while the vapor compression loop (Loop 2) is disabled (e.g., the compressor 515, circulation pump, and expansion nozzle 530 of Loop 2 are switched off). In a dew-point aware, sub-ambient cooling mode, the vapor compression loop (Loop 2) may be enabled based on whether a temperature of the liquid input to the cooling head (e.g., cooling head 510) is at or slightly higher than the dew point (e.g., where the goal is to maintain temperature of the liquid input to the cooling head 510 to be at or slightly higher than the dew point). In this mode, when Loop 2 is enabled, the Loop 1 bypass is also enabled (via valves 560a, 560b) to feed the liquid of Loop 1 directly into the intermediate heat exchanger 540 and to bypass heat exchanger 520 (see double-headed arrow 572). When Loop 2 is disabled, the Loop 1 bypass is also disabled so as to feed the liquid of Loop 1, as normal, into heat exchanger 520 (see single-headed arrow 571).

In a maximum performance, sub-ambient cooling mode, both the liquid cooling loop (Loop 1) and the vapor compression loop (Loop 2) may be enabled, irrespective of the dew point. In this mode, the Loop 1 bypass is also enabled (e.g., via valves 560a, 560b) to feed the liquid of Loop 1 directly into the intermediate heat exchanger 540 and to bypass heat exchanger 520 (see double-headed arrow 572). As should be understood, these operation modes are merely exemplary, and any number of factors may be used to determine whether and when to enable Loop 2.

Figure 6:
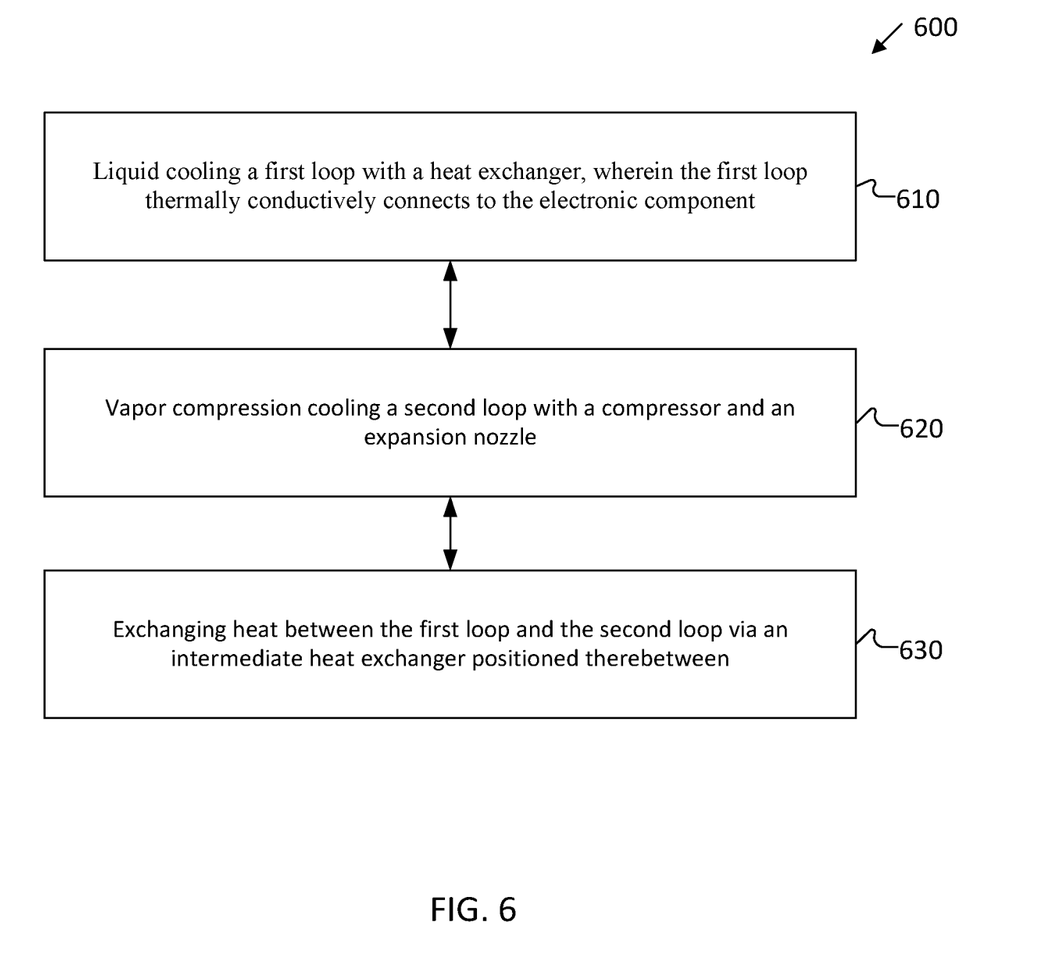
FIG. 6 depicts a schematic flow diagram of an exemplary method for vapor compression assisted liquid cooling of an electronic component.

FIG. 6 depicts a schematic flow diagram of a method 600 for cooling an electronic component with hybrid cooling loops. Method 600 may implement any of the features of the cooling loops described above.

Method 600 includes, in 610, liquid cooling a first loop with a heat exchanger, wherein the first loop thermally conductively connects to the electronic component. The method 600 also includes, in 610, vapor compression cooling a second loop with a compressor and an expansion nozzle. The method 600 also includes, in 620, exchanging heat between the first loop and the second loop via an intermediate heat exchanger positioned therebetween. The method 600 also includes, in 630, selectively activating the second loop based on a power consumption of the electronic component.

In the following, various examples are provided that may include one or more features of the load weight estimation discussed above. It may be intended that aspects described in relation to the devices may apply also to the described method(s), and vice versa.

Example 1 is a cooling device for cooling an electronic component, where the cooling device includes a liquid cooling loop with a heat exchanger, wherein the liquid cooling loop thermally conductively connects to the electronic component. The cooling device also includes a vapor compression cooling loop with a compressor and an expansion nozzle. The cooling device also includes an intermediate heat exchanger between the liquid cooling loop and the vapor compression cooling loop for exchanging heat between the liquid cooling loop and the vapor compression cooling loop. The cooling device also includes a controller configured to selectively activate the vapor compression cooling loop based on a power consumption of the electronic component.

Example 2 is the cooling device of example 1, wherein the vapor compression cooling loop further includes an other heat exchanger between the compressor and the expansion nozzle.

Example 3 is the cooling device of example 2, wherein the cooling device further includes a compressor bypass loop that connects the liquid cooling loop to the other heat exchanger and bypasses the compressor and the expansion nozzle, wherein the controller is configured to selectively activate the compressor bypass loop based on an operating mode of the cooling device.

Example 4 is the cooling device of example 3, wherein the operating mode in a standard mode includes the vapor compression cooling loop deactivated and the compressor bypass loop deactivated, and wherein the operating mode in an enhanced standard mode includes the vapor compression cooling loop deactivated and the compressor bypass loop activated, and the operating mode in a vapor compression cooling mode includes the vapor compression cooling loop activated and the compressor bypass loop deactivated.

Example 5 is the cooling device of any one of examples 1 to 4, wherein when the cooling device is in a standard cooling mode, the controller configured to deactivate the vapor compression cooling loop, wherein when the cooling device is in a vapor compression cooling mode, the controller configured to activate the vapor compression cooling loop.

Example 6 is the cooling device of example 5, wherein when the cooling device is in the vapor compression cooling mode, the heat exchanger is switched into the vapor compression cooling loop between the compressor and the expansion nozzle.

Example 7 is the cooling device of either one of examples 5 or 6, wherein when the cooling device is in the standard cooling mode, the heat exchanger is switched into the vapor compression cooling loop between the compressor and the expansion nozzle.

Example 8 is the cooling device of any one of examples 1 to 7, wherein the intermediate heat exchanger includes an evaporator.

Example 9 is the cooling device of any one of examples 1 to 8, wherein the heat exchanger includes a heatsink with liquid pipes.

Example 10 is the cooling device of example 9, wherein the heat exchanger further includes one or more fans for directing air towards the heatsink.

Example 11 is the cooling device of any one of examples 1 to 10, wherein the liquid cooling loop is configured to circulate liquid from a cooling head that is in contact with the electronic component, through the heat exchanger, and then through the intermediate heat exchanger.

Example 12 is the cooling device of example 11, wherein the cooling head includes a pump for circulating the liquid and a heatsink for contacting the electronic component through a thermal interface material.

Example 13 is the cooling device of any one of examples 1 to 12, wherein the controller is further configured to activate the vapor compression cooling loop to maintain a temperature at an input of the heat exchanger in the liquid cooling loop to be at or above dew point.

Example 14 is the cooling device of example 13, wherein the cooling device further includes a dew point sensor configured to determine the dew point.

Example 15 is the cooling device of any one of examples 1 to 14, wherein the heat exchanger further includes a heatsink and one or more fans for directing air towards the heatsink, wherein the controller is further configured to deactivate the fans if a temperature at an input of the heat exchanger in the liquid cooling loop is at or above ambient temperature.

Example 16 is the cooling device of any one of examples 1 to 15, wherein the liquid cooling loop is configured to circulate liquid from a cooling head that is in contact with the electronic component, through the heat exchanger, through the intermediate heat exchanger, and then back to the cooling head.

Example 17 is the cooling device of any one of examples 1 to 16, wherein the vapor compression cooling loop is configured to circulate a vapor from the intermediate heat exchanger and through the compressor to output a fluid to an other heat exchanger and then through the expansion nozzle to output the vapor back to the intermediate heat exchanger.

Example 18 is the cooling device of any one of examples 1 to 17, where in the controller is configured to activate the vapor compression cooling loop when the power consumption of the electronic component is higher than a power threshold and the controller is configured to deactivate the vapor compression cooling loop when the power consumption of the electronic component is less than or equal to the power threshold.

Example 19 is the cooling device of example 18, wherein the electronic component includes a processor and the power threshold includes a number of threaded processes executing in the processor.

Example 20 is a non-transitory, computer-readable medium including instructions that, when executed, cause one or more processors to selectively activate a vapor compression cooling loop based on a power consumption of an electronic component that is to be cooled by the vapor compression cooling loop, wherein the vapor compression cooling loop is thermally connected to a liquid cooling loop through an intermediate heat exchanger, wherein the liquid cooling loop is thermally conductively connected to the electronic component.

Example 21 is the non-transitory, computer-readable medium of example 20, wherein the vapor compression cooling loop further includes an other heat exchanger between the compressor and the expansion nozzle.

Example 22 is the non-transitory, computer-readable medium of example 21, wherein the instructions further enable a compressor bypass loop based on an operating mode of the cooling loops, wherein the compressor bypass loop connects the liquid cooling loop to an other heat exchanger of the vapor compression cooling loop and bypasses a compressor and an expansion nozzle of the vapor compression cooling loop.

Example 23 is the non-transitory, computer-readable medium of example 22, wherein when the operating mode is in a standard mode, the vapor compression cooling loop is deactivated and the compressor bypass loop deactivated, wherein when the operating mode is in an enhanced standard mode, the vapor compression cooling loop is deactivated and the compressor bypass loop is activated, and when the operating mode in is a vapor compression cooling mode, the vapor compression cooling loop activated and the compressor bypass loop deactivated.

Example 24 is the non-transitory, computer-readable medium of any one of examples 20 to 23, wherein when the cooling loop is in a standard cooling mode, the instructions are configured to deactivate the vapor compression cooling loop, wherein when the cooling loop is in a vapor compression cooling mode, the instructions are configured to activate the vapor compression cooling loop.

Example 25 is the non-transitory, computer-readable medium of example 24, wherein when the cooling loop is in the vapor compression cooling mode, the instructions switch the heat exchanger into the vapor compression cooling loop between a compressor and a expansion nozzle of the vapor compression cooling loop.

Example 26 is the non-transitory, computer-readable medium of either one of examples 24 or 25, wherein when the cooling loop is in the standard cooling mode, the instructions switch the heat exchanger into the vapor compression cooling loop between a compressor and an expansion nozzle of the vapor compression cooling loop.

Example 27 is the non-transitory, computer-readable medium of any one of examples 20 to 26, wherein the intermediate heat exchanger includes an evaporator.

Example 28 is the non-transitory, computer-readable medium of any one of examples 20 to 27, wherein the heat exchanger includes a heatsink with liquid pipes.

Example 29 is the non-transitory, computer-readable medium of example 28, wherein the heat exchanger further includes one or more fans for directing air towards the heatsink.

Example 30 is the non-transitory, computer-readable medium of any one of examples 20 to 29, wherein the instructions cause the liquid cooling loop to circulate liquid from a cooling head that is in contact with the electronic component, through the heat exchanger, and then through the intermediate heat exchanger.

Example 31 is the non-transitory, computer-readable medium of example 30, wherein the cooling head includes a pump for circulating the liquid and a heatsink for contacting the electronic component through a thermal interface material.

Example 32 is the non-transitory, computer-readable medium of any one of examples 20 to 31, wherein the instructions further configured to activate the vapor compression cooling loop to maintain a temperature at an input of the heat exchanger in the liquid cooling loop to be at or above dew point.

Example 33 is the non-transitory, computer-readable medium of example 32, wherein the instructions cause a dew point sensor to determine the dew point.

Example 34 is the non-transitory, computer-readable medium of any one of examples 20 to 33, wherein the heat exchanger further includes a heatsink and one or more fans for directing air towards the heatsink, wherein the instructions further cause the fans to deactivate if a temperature at an input of the heat exchanger in the liquid cooling loop is at or above ambient temperature.

Example 35 is the non-transitory, computer-readable medium of any one of examples 20 to 34, wherein the instructions cause the liquid cooling loop to circulate liquid from a cooling head that is in contact with the electronic component, through the heat exchanger, through the intermediate heat exchanger, and then back to the cooling head.

Example 36 is the non-transitory, computer-readable medium of any one of examples 20 to 35, wherein the instructions cause the vapor compression cooling loop to circulate a vapor from the intermediate heat exchanger and through the compressor to output a fluid to an other heat exchanger and then through the expansion nozzle to output the vapor back to the intermediate heat exchanger.

Example 37 is the non-transitory, computer-readable medium of any one of examples 20 to 36, where in the instructions further activate the vapor compression cooling loop when the power consumption of the electronic component is higher than a power threshold and the instructions deactivate the vapor compression cooling loop when the power consumption of the electronic component is less than or equal to the power threshold.

Example 38 is the non-transitory, computer-readable medium of example 37, wherein the electronic component includes a processor and the power threshold includes a number of threaded processes executing in the processor.

Example 21 is an apparatus for cooling an electronic component, where the apparatus includes a means for liquid cooling a first loop with a heat exchanging means, wherein the first loop thermally conductively connects to the electronic component. The apparatus also includes a means for vapor compression cooling a second loop with a compressing means and an expansion means. The apparatus also includes an intermediate heat exchanging means between the first loop and the second loop for exchanging heat between the first loop and the second loop. The apparatus also includes a controlling means for selectively activating the second loop based on a power consumption of the electronic component.

Example 21 is the apparatus of example 20, wherein the second loop further includes an other heat exchanging means between the compressing means and the expansion means.

Example 22 is the apparatus of example 21, wherein the apparatus further includes a means for bypassing the compressing means that connects the first loop to the other heat exchanging means and bypasses the compressing means and the expansion means, wherein the controlling means is configured to selectively activate the means for bypassing the compressing means based on an operating mode of the apparatus.

Example 23 is the apparatus of example 22, wherein the operating mode in a standard mode includes that the second loop is deactivated and the means for bypassing the compressing means is deactivated, and wherein the operating mode in an enhanced standard mode includes that the second loop is deactivated and the means for bypassing the compressing means is activated, and wherein the operating mode in a vapor compression cooling mode includes that the second loop is activated and the means for bypassing the compressing means is deactivated.

Example 24 is the apparatus of any one of examples 20 to 23, wherein when the apparatus is in a standard cooling mode, the controlling means is configured to deactivate the second loop, wherein when the apparatus is in a vapor compression cooling mode, the controlling means is configured to activate the second loop.

Example 25 is the apparatus of example 24, wherein when the apparatus is in the vapor compression cooling mode, the heat exchanging means is switched into the second loop between the compressing means and the expansion means.

Example 26 is the apparatus of either one of examples 24 or 25, wherein when the apparatus is in the standard cooling mode, the heat exchanging means is switched into the second loop between the compressing means and the expansion means.

Example 27 is the apparatus of any one of examples 20 to 26, wherein the intermediate heat exchanging means includes an evaporating means.

Example 28 is the apparatus of any one of examples 20 to 27, wherein the heat exchanging means includes a heatsinking means with liquid pipes.

Example 29 is the apparatus of example 28, wherein the heat exchanging means further includes one or more means for directing air towards the heatsinking means.

Example 30 is the apparatus of any one of examples 20 to 29, wherein the first loop is configured to circulate liquid from a cooling head that is in contact with the electronic component, through the heat exchanging means, and then through the intermediate heat exchanging means.

Example 31 is the apparatus of example 30, wherein the cooling head includes a pumping means for circulating the liquid and a heatsinking means for contacting the electronic component through a thermal interfacing means.

Example 32 is the apparatus of any one of examples 20 to 31, wherein the controlling means is further configured to activate the second loop to maintain a temperature at an input of the heat exchanging means in the first loop to be at or above dew point.

Example 33 is the apparatus of example 32, wherein the apparatus further includes a means for sensing a dew point.

Example 34 is the apparatus of any one of examples 20 to 33, wherein the heat exchanging means further includes a heatsinking means and one or more means for directing air towards the heatsinking means, wherein the controlling means is further configured to deactivate the means for directing air if a temperature at an input of the heat exchanging means in the first loop is at or above ambient temperature.

Example 35 is the apparatus of any one of examples 20 to 34, wherein the first loop is configured to circulate liquid from a cooling head that is in contact with the electronic component, through the heat exchanging means, through the intermediate heat exchanging means, and then back to the cooling head.

Example 36 is the apparatus of any one of examples 20 to 35, wherein the second loop is configured to circulate a vapor from the intermediate heat exchanging means and through the compressing means to output a fluid to an other heat exchanging means and then through the expansion means to output the vapor back to the intermediate heat exchanging means.

Example 37 is the apparatus of any one of examples 20 to 36, where in the controlling means is configured to activate the second loop when the power consumption of the electronic component is higher than a power threshold and the controlling means is configured to deactivate the second loop when the power consumption of the electronic component is less than or equal to the power threshold.

Example 38 is the apparatus of example 37, wherein the electronic component includes a processor and the power threshold includes a number of threaded processes executing in the processor.

Example 21 is an method for cooling an electronic component, where the method includes liquid cooling a first loop with a heat exchanger, wherein the first loop thermally conductively connects to the electronic component. The method also includes vapor compression cooling a second loop with a compressor and an expansion nozzle. The method also includes exchanging heat between the first loop and the second loop via an intermediate heat exchanger positioned therebetween. The method also includes selectively activating the second loop based on a power consumption of the electronic component.

Example 21 is the method of example 20, wherein the second loop further includes an other heat exchanger between the compressor and the expansion nozzle.

Example 22 is the method of example 21, wherein the method further includes bypassing the compressor that connects the first loop to the other heat exchanger and bypasses the compressor and the expansion nozzle, wherein the method further includes selectively bypassing the compressor based on an operating mode of the method.

Example 23 is the method of example 22, wherein when the operating mode is in a standard mode, the method deactivates the second loop and deactivates bypassing the compressor, wherein when the operating mode is in an enhanced standard mode, the method deactivates the second loop and activates the compressor, and wherein when the operating mode is in a vapor compression cooling mode, the method activates the second loop and deactivates bypassing the compressor.

Example 24 is the method of any one of examples 20 to 23, wherein the method includes deactivating the second loop to cool the electronic component in a standard cooling mode, wherein the method includes activating the second loop to cool the electronic component in a vapor compression cooling mode.

Example 25 is the method of example 24, wherein when cooling the electronic component in the vapor compression cooling mode, the method includes switching the heat exchanger into the second loop between the compressor and the expansion nozzle.

Example 26 is the method of either one of examples 24 or 25, wherein when cooling the electronic component in the standard cooling mode, the method includes switching the heat exchanger into the second loop between the compressor and the expansion nozzle.

Example 27 is the method of any one of examples 20 to 26, wherein the intermediate heat exchanger includes an evaporator.

Example 28 is the method of any one of examples 20 to 27, wherein the heat exchanger includes a heatsink with liquid pipes.

Example 29 is the method of example 28, wherein the method includes directing air towards the heatsink of the heat exchanger.

Example 30 is the method of any one of examples 20 to 29, wherein the method includes circulating in the first loop liquid from a cooling head that is in contact with the electronic component, through the heat exchanger, and then through the intermediate heat exchanger.

Example 31 is the method of example 30, wherein the method includes circulating the liquid and so as to thermally contact (e.g., via a heatsink) the electronic component through a thermal interface.

Example 32 is the method of any one of examples 20 to 31, the method further includes activating the second loop to maintain a temperature at an input of the heat exchanger in the first loop to be at or above dew point.

Example 33 is the method of example 32, wherein the method further includes determining a dew point (e.g., via a sensor).

Example 34 is the method of any one of examples 20 to 33, wherein the method includes deactivating one or more fans that direct air over a heatsink of the heat exchanger if a temperature at an input of the heat exchanging means in the first loop is at or above ambient temperature.

Example 35 is the method of any one of examples 20 to 34, wherein the method includes circulating a liquid in the first loop from a cooling head that is in contact with the electronic component, through the heat exchanger, through the intermediate heat exchanger, and then back to the cooling head.

Example 36 is the method of any one of examples 20 to 35, wherein the method further includes circulating in the second loop a vapor from the intermediate heat exchanger and through the compressor to output a fluid to an other heat exchanger and then through the expansion nozzle to output the vapor back to the intermediate heat exchanger.

Example 37 is the method of any one of examples 20 to 36, where in the method includes activating the second loop when the power consumption of the electronic component is higher than a power threshold and deactivating the second loop when the power consumption of the electronic component is less than or equal to the power threshold.

Example 38 is the method of example 37, wherein the electronic component includes a processor and the power threshold includes a number of threaded processes executing in the processor.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

The invention claimed is:

1. A cooling device for cooling an electronic component, the cooling device comprising:
   a liquid cooling loop with a heat exchanger, wherein the liquid cooling loop thermally conductively connects to the electronic component;
   a vapor compression cooling loop with a compressor and an expansion nozzle;
   an intermediate heat exchanger between the liquid cooling loop and the vapor compression cooling loop for exchanging heat between the liquid cooling loop and the vapor compression cooling loop; and
   a controller configured to selectively activate the vapor compression cooling loop based on a power consumption of the electronic component.

2. The cooling device of claim 1, wherein the vapor compression cooling loop further comprises an other heat exchanger between the compressor and the expansion nozzle.

3. The cooling device of claim 2, the cooling device further comprising a compressor bypass loop that connects the liquid cooling loop to the other heat exchanger and bypasses the compressor and the expansion nozzle, wherein the controller is configured to selectively activate the compressor bypass loop based on an operating mode of the cooling device.

4. The cooling device of claim 3, wherein when the operating mode is in a standard mode, the vapor compression cooling loop is deactivated and the compressor bypass loop is deactivated, wherein when the operating mode is in an enhanced standard mode, the vapor compression cooling loop is deactivated and the compressor bypass loop is activated, and when the operating mode is in a vapor compression cooling mode, the vapor compression cooling loop is activated and the compressor bypass loop is deactivated.

5. The cooling device of any one of claim 1, wherein the cooling device in a standard cooling mode comprises the controller configured to deactivate the vapor compression cooling loop, wherein the cooling device in a vapor compression cooling mode comprises the controller configured to activate the vapor compression cooling loop.

6. The cooling device of claim 5, wherein when the cooling device is in the vapor compression cooling mode, the heat exchanger is switched into the vapor compression cooling loop between the compressor and the expansion nozzle.

7. The cooling device of either one of claim 5, wherein when the cooling device is in the standard cooling mode, the heat exchanger is switched into the vapor compression cooling loop between the compressor and the expansion nozzle.

8. The cooling device of any one of claim 1, wherein the liquid cooling loop is configured to circulate liquid from a cooling head that is in contact with the electronic component, through the heat exchanger, and then through the intermediate heat exchanger.

9. The cooling device of claim 8, wherein the cooling head comprises a pump for circulating the liquid and a heatsink for contacting the electronic component through a thermal interface material.

10. The cooling device of claim 1, wherein the controller is further configured to activate the vapor compression cooling loop to maintain a temperature at an input of the heat exchanger in the liquid cooling loop to be at or above dew point.

11. The cooling device of claim 10, the cooling device further comprising a dew point sensor configured to determine the dew point.

12. The cooling device of claim 1, wherein the heat exchanger further comprises a heatsink and one or more fans for directing air towards the heatsink, wherein the controller is further configured to deactivate the fans if a temperature at an input of the heat exchanger in the liquid cooling loop is at or above ambient temperature.

13. The cooling device of claim 1, wherein the liquid cooling loop is configured to circulate liquid from a cooling head that is in contact with the electronic component, through the heat exchanger, through the intermediate heat exchanger, and then back to the cooling head.

14. The cooling device of claim 1, wherein the vapor compression cooling loop is configured to circulate a vapor from the intermediate heat exchanger and through the compressor to output a fluid to an other heat exchanger and then through the expansion nozzle to output the vapor back to the intermediate heat exchanger.

15. The cooling device of claim 1, where in the controller is configured to activate the vapor compression cooling loop when the power consumption of the electronic component is higher than a power threshold and the controller is configured to deactivate the vapor compression cooling loop when the power consumption of the electronic component is less than or equal to the power threshold.

16. The cooling device of claim 15, wherein the electronic component comprises a processor and the power threshold comprises a number of threaded processes executing in the processor.

17. A cooling system comprising:
a first cooling loop and second cooling loop in a hybrid cooling configuration, wherein the first cooling loop comprises a liquid cooling loop with a heat exchanger thermally connected to an electronic component and the second cooling loop comprises a vapor compression cooling loop with a compressor and an expansion nozzle;
an intermediate heat exchanger that exchanges heat between the liquid cooling loop and the vapor compression cooling loop; and
a controller configured to selectively activating the vapor compression cooling loop based on a power consumption of the electronic component.

18. The cooling system of claim 17, the cooling system further comprising an additional heat exchanger between the compressor and the expansion nozzle in the vapor compression cooling loop.

19. A non-transitory, computer-readable medium comprising instructions that, when executed, cause one or more processors to:
selectively activate a vapor compression cooling loop based on a power consumption of an electronic component that is to be cooled by the vapor compression cooling loop, wherein the vapor compression cooling loop is thermally connected to a liquid cooling loop through an intermediate heat exchanger, wherein the liquid cooling loop is thermally conductively connected to the electronic component and comprises a heat exchanger; and
enable a compressor bypass loop based on an operating mode of cooling, wherein the compressor bypass loop connects the liquid cooling loop to an other heat exchanger of the vapor compression cooling loop and bypasses a compressor and an expansion nozzle of the vapor compression cooling loop.

20. The non-transitory, computer-readable medium of claim 19, wherein the instructions cause the liquid cooling loop to circulate liquid from a cooling head that is in contact with the electronic component, through the heat exchanger of the liquid cooling loop, and then through the intermediate heat exchanger.

* * * * *